United States Patent [19]
Chen et al.

[11] Patent Number: 6,034,880
[45] Date of Patent: Mar. 7, 2000

[54] EMBEDDED MEMORY DEVICE AND METHOD OF PERFORMING A BURN-IN PROCESS ON THE EMBEDDED MEMORY DEVICE

[75] Inventors: Tony Chen, Ping-Chen; Jowsoon Hsu, Tainan Hsien; Gauss Chang, Hsinchu, all of Taiwan

[73] Assignee: Winbond Electronics Corp., Taiwan

[21] Appl. No.: 09/136,502

[22] Filed: Aug. 19, 1998

[30] Foreign Application Priority Data

May 18, 1998 [TW] Taiwan ................................. 87107659

[51] Int. Cl.⁷ .................................................... G11C 13/00
[52] U.S. Cl. ......................................... 365/96; 365/189.05
[58] Field of Search ................................ 365/96, 189.01, 365/189.05, 230.08

[56] References Cited

U.S. PATENT DOCUMENTS 5,905,687 5/1999 Brede et al. ............................... 365/96

Primary Examiner—Terrell W. Fears
Attorney, Agent, or Firm—Blakely Sokoloff Taylor & Zafman

[57] ABSTRACT

An embedded memory device is designed in such a manner that allows the embedded memory device to undergo the burn-in process more conveniently and efficiently without the need to use complex control timing. Moreover, the embedded memory device allows the burn-in board to be simpler than the prior art in layout structure. The embedded memory device includes the following: a memory unit having an address decoder and a sense amplifier; a control logic unit capable of generating an output of system data and an output of system address; a first counter which is driven by a system clock signal for generating an output of counter address; a second counter which is capable of generating an output of counter data; an address buffer, under control by a burn-in signal, for selecting either the system address or the counter address as memory address to the address decoder; and a data buffer, also under control by the burn-in signal, for selecting the counter data or the system data as memory data to the sense amplifier. The foregoing architecture for the embedded memory device allows the burn-in process to be performed more cost-effectively than the prior art.

33 Claims, 2 Drawing Sheets

EMBEDDED MEMORY DEVICE AND METHOD OF PERFORMING A BURN-IN PROCESS ON THE EMBEDDED MEMORY DEVICE

CROSS-REFERENCE TO RELATED APPLICATION

This application claims the priority benefit of Taiwan application serial no. 87107659, filed May 18, 1998, the full disclosure of which is incorporated herein by reference.

BACKGROUND OF THE INVENTION

1. Field of the Invention

This invention relates to memory devices, and more particularly, to an embedded memory device and a method of performing a burn-in process on such an embedded memory device.

2. Description of Related Art

An embedded memory device is a type of memory device that integrates both the memory cells and the associated control logic circuit on the same integrated circuit (IC) chip. After an embedded memory device is completed in fabrication, it usually undergoes a burn-in process to test the reliability thereof.

Burn-in is the operation of a new IC product for a specified time under accelerated aging conditions prior to the shipment so as to sort out premature failures. The burn-in operation is an essential step for testing the reliability of the IC products. Conventionally, the burn-in process is performed after the IC chip is already packaged. During the burn-in process, all of the memory cells in the memory device are sequentially accessed to perform read/write operations to check if each memory cell can reliably hold data therein.

One conventional burn-in process is performed in such a manner that a plurality of IC memory devices are mounted together on a burn-in board, and then the burn-in board is placed in a burn-in oven to allow all the IC memory devices thereon to undergo the burn-in process simultaneously. Since a conventional burn-in board is limited in the number of pins and the layout area for power source, control circuits, address and data buses, the total number of IC memory devices that can be mounted together on the burn-in board for simultaneous burn-in test is limited. The throughput of the burn-in test is therefore low. Moreover, sharing the same data buses and power lines between a large number of IC memory devices on the burn-in board can cause delays to the test signals and insufficient power supply to the IC memory devices being tested.

SUMMARY OF THE INVENTION

It is therefore an objective of the present invention to provide a new architecture for embedded memory devices, which architecture is simple and requires no complex control timing to perform a burn-in process.

It is another objective of the present invention to provide a new architecture for embedded memory devices, which architecture can help reduce the layout area of the burn-in board on which the embedded memory devices are mounted for a burn-in test, allowing the burn-in board to be more efficiently utilized to increase throughput.

It is still another objective of the present invention to provide a new architecture for embedded memory devices, which architecture can help the memory devices to undergo a burn-in process more efficiently.

In accordance with the foregoing and other objectives of the present invention, a new architecture for embedded memory device and a method of performing a burn-in process on such an embedded memory device are provided.

The embedded memory device according to the invention includes a memory unit, a control logic unit, a first counter, a second counter, an address buffer and a data buffer.

The memory unit includes an address decoder and a sense amplifier. The control logic unit is capable of generating an output of system data and an output of system address. The first counter is driven by a system clock signal and is used for generating an output of counter address. The second counter is capable of generating an output of counter data in response to the most significant bit of the output counter address from the first counter. The address buffer is under control by a burn-in signal. The address buffer is used for selecting either the system address from the control logic unit or the counter address from the first counter as the memory address for the address decoder. In such a manner that when the burn-in signal is switched to a first logic state, the counter address is selected and when the burn-in signal is switched to a second logic state, the system address is selected. The data buffer is also under control by the burn-in signal. The data buffer is used for selecting either the counter data from the second counter or the system data from the control logic unit as memory data for the sense amplifier. In such a manner that when the burn-in signal is switched to the first logic state, the counter data is selected and when the burn-in signal is switched to the second logic state, the system data is selected.

The foregoing embedded memory device of the invention allows the burn-in board to provide only one signal input port, i.e., the clock signal input port. Therefore, the burn-in board is simpler than prior art in layout. Moreover, the embedded memory device of the invention can be implemented with counters and pass gates, allowing the embedded memory device to be simpler than the prior art in architectural complexity. The invention is therefore more advantageous than the prior art.

The embedded memory device of the invention further comprises a NAND gate having a first input end connected to an input pin for receiving an externally generated clock signal and a second input end connected to receive the burn-in signal. The output of the NAND gate serves as the clock signal used to drive the first counter.

Moreover, in a preferred embodiment of the invention, the first counter is a multi-bit counter, while the second counter is a one-bit counter.

The address buffer includes an inverter, a first pass gate, and a second pass gate. The first pass gate has a first data port for outputting the system address, if selected, as the memory address, a second data port for receiving the system address, a first control port connected to the output of the inverter, and a second control port connected to receive the burn-in signal. The second pass gate has a third data port for outputting the counter address, if selected, as the memory address, a fourth data port for receiving the counter address, a third control port connected to receive the burn-in signal, and a fourth control port connected to the output of the inverter. The inverter has an input end connected to receive the burn-in signal and an output end connected to both the first control port of the first pass gate and the fourth control port of the second pass gate.

The data buffer includes an inverter, a third pass gate, and a fourth pass gate. The third pass gate has a fifth data port for outputting the counter data, if selected, as the memory data, a sixth data port for receiving the counter data, a fifth control port connected to receive the burn-in signal, and a sixth control port connected to the output of the inverter. The fourth pass gate having a seventh data port for outputting the system data, if selected, as the memory data, an eighth data port for receiving the system data, a seventh control port connected to the output of the inverter, and an eighth control port connected to receive the burn-in signal. The inverter has an input end connected to receive the burn-in signal, and an output end connected to both the sixth control port of the third pass gate and the seventh control port of the fourth pass gate.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a new architecture for an embedded memory device, which architecture is simple and requires no complex control timing to perform a burn-in process on the memory device. Moreover, the invention can help reduce the layout area of the burn-in board on which the embedded memory device is mounted for a burn-in test, allowing the burn-in board to be more efficiently utilized to increase throughput. Furthermore, the invention and can help the memory device to undergo a burn-in process more efficiently than the prior art. A preferred embodiment of the embedded memory device of the invention is disclosed in the following with reference to FIGS. 1–3.

Figure 1:
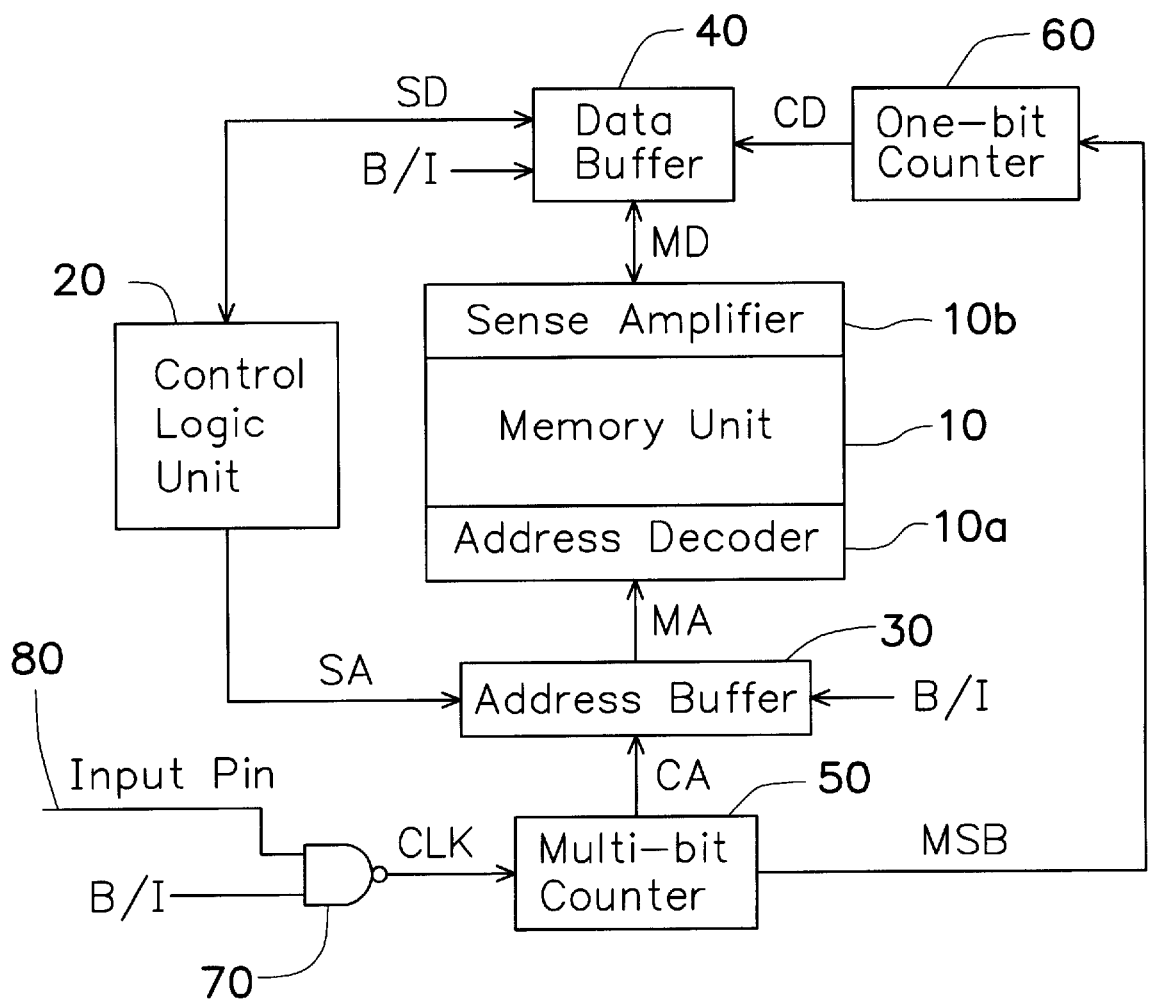
FIG. 1 is a schematic block diagram showing the architecture of the embedded memory device according to the invention.

FIG. 1 is a schematic block diagram of the embedded memory device according to the invention. As shown, the embedded memory device of the invention includes a memory unit 10, a control logic unit 20, an address buffer 30, a data buffer 40, a multi-bit counter 50, and a one-bit counter 60. Furthermore, the memory unit 10 includes an address decoder 10a and a sense amplifier 10b.

During a burn-in process, the multi-bit counter 50 generates an output of counter address CA to the address buffer 30 which then takes the counter address CA as an output of memory address MA to the address decoder 10a.

Figure 2:
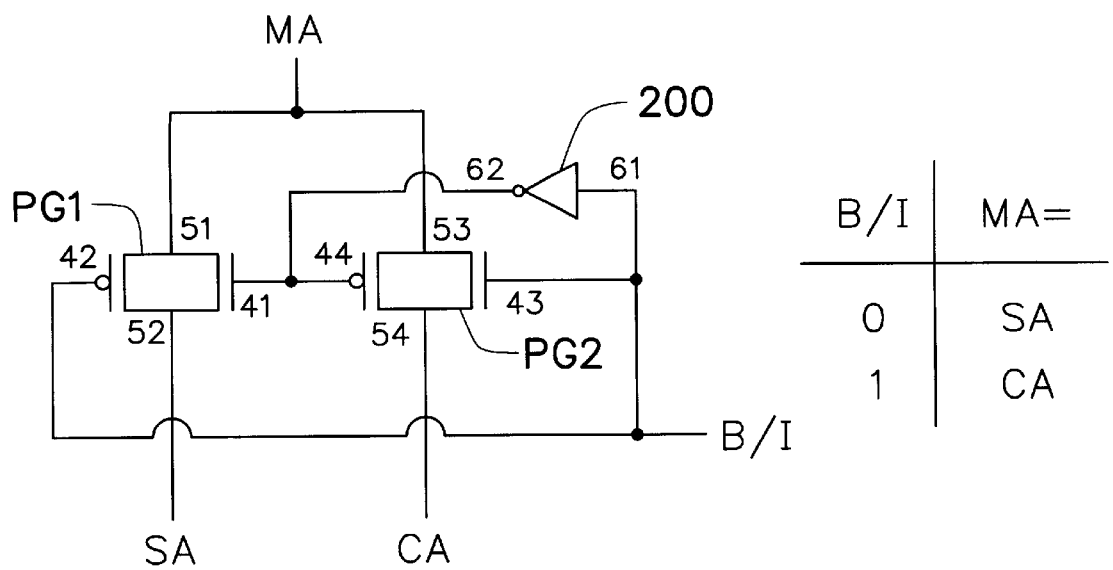
FIG. 2 is a schematic diagram showing the inside structure of the address buffer utilized in the embedded memory device of FIG. 1.

FIG. 2 is a schematic diagram showing the inside structure of the address buffer 30 utilized in the embedded memory device of FIG. 1. As shown, the address buffer 30 includes a first pass gate PG1, a second pass gate PG2, and an inverter 200. When the burn-in signal B/I is switched to a logic-high state, or connected to the system voltage $V_{CC}$, it switches the first pass gate PG1 to the non-conducting state (OFF) and the first pass gate PG1 to the conducting state (ON), thus allowing the memory address MA to take on the counter address CA. On the other hand, when the burn-in signal B/I is switched to a logic-low state, it switches the first pass gate PG1 to the conducting state (ON) and the second pass gate PG2 to the non-conducting state (OFF), thus allowing the memory address MA to take on the system address SA.

Referring back to FIG. 1, during the burn-in process, the one-bit counter 60 generates an output of counter data CD to the data buffer 40 which then takes the counter data CD as an output of memory data MD to the sense amplifier 10b.

Figure 3:
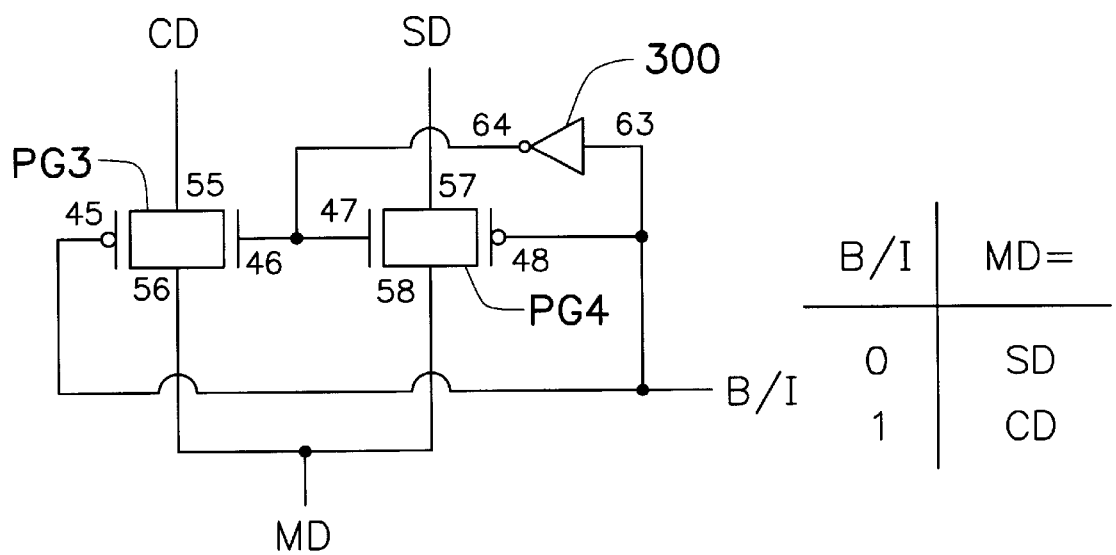
FIG. 3 is a schematic diagram showing the inside structure of the data buffer utilized in the embedded memory device of FIG. 1.

FIG. 3 is a schematic diagram showing the inside structure of the data buffer 40 utilized in the embedded memory device of FIG. 1. As shown, the data buffer 40 includes a third pass gate PG3, a fourth pass gate PG4, and an inverter 300. When the burn-in signal B/I is switched to a logic-high state, or connected to the system voltage $V_{CC}$, it switches the third pass gate PG3 to the conducting state (ON) and the fourth pass gate PG4 to the non-conducting state (OFF), thus allowing the memory data MD to take on the counter data CD. On the other hand, when the burn-in signal B/I is switched to a logic-low state or connected to the ground, it switches the third pass gate PG3 to the non-conducting state (OFF) and the fourth pass gate PG4 to the conducting state (ON), thus allowing the memory data MD to take on the system data SD.

The one-bit counter 60 is controlled by the maximum significant bit (MSB) of the current count value of the multi-bit counter 50. The one-bit counter 60 is used to output the two binary values 0 and 1 in an alternating manner in such a manner that each time all the addresses of the memory device have been scanned once, the counter data CD is switched to the other logic value, for example from 1 to 0 or from 0 to 1. During the burn-in process (i.e. when the burn-in signal B/I is switched to the logic-high state), this allows every memory cell to be exercised by successively writing 0 and 1 thereto in order to test the data storage capability thereof. When the burn-in signal B/I is switched to the logic-low state, the memory data MD takes on the system data SD from the control logic unit 20 instead of the counter data CD from the one-bit counter 60, thus allowing the memory device to resume normal operation.

The multi-bit counter 50 is driven by a clock signal CLK. If the memory device has no built-in clock signal pins, the clock signal CLK can be obtained externally via a NAND gate 70 which has one input end connected to an input pin 80 and the other input end connected to the burn-in signal B/I. When the burn-in signal B/I is switched to the high-voltage logic state (i.e., when the burn-in process is initiated), the external clock signal supplied by the burn-in board (not shown) can be transferred via the NAND gate 70 to serve as the clock signal CLK to the multi-bit counter 50, allowing the multi-bit counter 50 to be driven by the external clock signal. When the burn-in process is completed (i.e., the burn-in signal B/I is switched to the logic-low state), the NAND gate 70 is disabled to cut off the external clock signal received via the input pin 80.

In conclusion, it can be learned from the foregoing description that the invention provides a new architecture for an embedded memory device, which includes a memory unit 10, a control logic unit 20, an address buffer 30, a data buffer 40, a multi-bit counter 50, and a one-bit counter 60. Further, the memory unit 10 includes an address decoder 10a and a sense amplifier 10b. The control logic unit 20 is used to generate an output of a system address SA and an output of system data SD for testing the access operation to the memory unit 10. The multi-bit counter 50 is driven by a clock signal CLK to generate a counter address CA, and whose most significant bit MSB is used to drive the one-bit counter 60 to generate an output of counter data CD. The address buffer 30 is controlled by the burn-in signal B/I to select between the system address SA from the control logic unit 20 and the counter address CA from the multi-bit counter 50 as the output thereof. The output of the address buffer 30 is used as memory address MA, which is transferred to the address decoder 10a. The data buffer 40 is controlled by the burn-in signal B/I to select between the system data SD from the control logic unit 20 and the counter data CD from the one-bit counter 60 as the output thereof. The output of the data buffer 40 is used as memory data MD, which is then transferred to the sense amplifier 10b.

Moreover, the embedded memory device includes a NAND gate 70 having a first input end connected to an input pin 80 of the IC chip to receive an externally generated clock signal and a second input connected to receive the burn-in signal B/I. The output of the NAND gate 70 serves as the clock signal CLK to drive the multi-bit counter 50.

Referring to FIG. 2, the address buffer 30 includes a first pass gate PG1, a second pass gate PG2, and an inverter 200. The first pass gate PG1 has a first data port 51 for outputting the system address SA (when selected) as the memory address MA, a second data port 52 for receiving the system address SA, a first control port 41 connected to receive the inverted version of the burn-in signal B/I via the inverter 200, and a second control port 42 connected to receive the burn-in signal B/I directly. The second pass gate PG2 has a third data port 53 for outputting the counter address CA (when selected) as the memory address MA, a fourth data port 54 for receiving the counter address CA, a third control port 43 connected to receive the burn-in signal B/I directly, and a fourth control port 44 connected to receive the inverted version of the burn-in signal B/I via the inverter 200. Furthermore, the inverter 200 has an input end 61 connected to receive the burn-in signal B/I, and an output end 62 connected to both the first control port 41 of the first pass gate PG1 and the fourth control port 44 of the second pass gate PG2.

Referring to FIG. 3, the data buffer 40 includes a third pass gate PG3, a fourth pass gate PG4, and an inverter 300. The third pass gate PG3 has a sixth data port 56 for outputting the counter data CD (when selected) as the memory data MD, a fifth data port 55 for receiving the counter data CD, a fifth control port 45 connected to receive the burn-in signal B/I directly, and a sixth control port 46 connected to receive the inverted version of the burn-in signal B/I via the inverter 300. The fourth pass gate PG4 has an eighth data port 58 for outputting the system data SD (when selected) as the memory data MD, a seventh data port 57 for receiving the system data SD, a seventh control port 47 connected to receive the inverted version of the burn-in signal B/I via the inverter 300, and an eighth control port 48 connected to receive the burn-in signal B/I directly. Further, the inverter 300 has an input end 63 connected to receive the burn-in signal B/I, and an output end 64 connected to both the sixth control port 46 of the third pass gate PG3 and the seventh control port 47 of the fourth pass gate PG4.

In FIG. 2 and FIG. 3, the first control port 41, the third control port 43, the fifth control port 45, and the seventh control port 47 are each a positive control port of the respective pass gate, while the second control port 42, the fourth control port 44, the sixth control port 46, and the eighth control port 48 are each a negative control port of the respective pass gate. Each of the pass gates PG1, PG2, PG3, PG4 operates in such a manner that when a high-voltage logic signal is applied to the positive control port thereof or when a low-voltage logic state is applied to the negative control port thereof, it is switched to a conducting state, allowing the two data ports thereof to be interconnected to a conducting state.

It can be learned from the foregoing description that the embedded memory device of the invention allows the burn-in board (on which the embedded memory device is mounted for burn-in test) to provide only one input signal, i.e., the above-mentioned externally generated clock signal, to the embedded memory device. Therefore, the layout structure of the burn-in board can be made more simply than that of the prior art Moreover, the embedded memory device of the invention can be implemented with simple components such as counters and pass gates, allowing the embedded memory device to be simpler than the prior art in architectural complexity. The invention is therefore more advantageous than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements

What is claimed is:

1. An embedded memory device, which comprises:
   a memory unit including an address decoder and a sense amplifier;
   a control logic unit, which is capable of generating an output of system data and an output of system address;
   a first counter, which is driven by a system clock signal for generating an output of counter address;
   a second counter, which is capable of generating an output of counter data in response to the most significant bit of the output counter address from the first counter;
   an address buffer, under control by a burn-in signal, for selecting either the system address from the control logic unit or the counter address from the first counter as memory address to the address decoder, in such a manner that when the burn-in signal is switched to a first logic state, the counter address is selected, and when the burn-in signal is switched to a second logic state, the system address is selected; and
   a data buffer, also under control by the burn-in signal, for selecting either the counter data from the second counter or the system data from the control logic unit as memory data to the sense amplifier, in such a manner that when the burn-in signal is switched to the first logic state, the counter data is selected, and when the burn-in signal is switched to the second logic state, the system data is selected.

2. The embedded memory device of claim 1, wherein the first counter is a multi-bit counter.

3. The embedded memory device of claim 1, wherein the second counter is a one-bit counter.

4. The embedded memory device of claim 1, wherein the address buffer includes:
   an inverter whose input end is connected to receive the burn-in signal;
   a first pass gate having a first data port for outputting the system address, if selected, as the memory address, a second data port for receiving the system address, a first control port connected to the output of the inverter, and a second control port connected to receive the burn-in signal; and
   a second pass gate having a third data port for outputting the counter address, if selected, as the memory address, a fourth data port for receiving the counter address, a third control port connected to receive the burn-in signal, and a fourth control port connected to the output of the inverter.

5. The embedded memory device of claim 4, wherein the first control port is a positive control port of the first pass gate, which, when receiving a high-voltage logic state, causes the first pass gate to be switched to a conducting state.

6. The embedded memory device of claim 4, wherein the second control port is a negative control port of the first pass gate, which, when receiving a low-voltage logic state, causes the first pass gate to be switched to a conducting state.

7. The embedded memory device of claim 4, wherein the third control port is a positive control port of the second pass gate, which, when receiving a high-voltage logic state, causes the first pass gate to be switched to a conducting state.

8. The embedded memory device of claim 4, wherein the fourth control port is a negative control port of the second pass gate, which, when receiving a low-voltage logic state, causes the second pass gate to be switched to a conducting state.

9. The embedded memory device of claim 1, wherein the data buffer includes:

an inverter whose input end is connected to receive the burn-in signal;

a third pass gate having a fifth data port for outputting the counter data, if selected, as the memory data, a sixth data port for receiving the counter data, a fifth control port connected to receive the burn-in signal, and a sixth control port connected to the output of the inverter; and a fourth pass gate having a seventh data port for outputting the system data, if selected, as the memory data, an eighth data port for receiving the system data, a seventh control port connected to the output of the inverter, and an eighth control port connected to receive the burn-in signal.

10. The embedded memory device of claim 9, wherein the fifth control port is a positive control port of the third pass gate, which, when receiving a high-voltage logic state, causes the third pass gate to be switched to conducting state.

11. The embedded memory device of claim 9, wherein the sixth control port is a negative control port of the third pass gate, which, when receiving a low-voltage logic state, causes the third pass gate to be switched to conducting state.

12. The embedded memory device of claim 9, wherein the seventh control port is a positive control port of the fourth pass gate, which, when receiving a high-voltage logic state, causes the fourth pass gate to be switched to conducting state.

13. The embedded memory device of claim 9, wherein the eighth control port is a negative control port of the fourth pass gate, which, when receiving a low-voltage logic state, causes the fourth pass gate to be switched to conducting state.

14. The embedded memory device of claim 1, further comprising:

a NAND gate having a first input end connected to an input pin for receiving an externally generated clock signal and a second input end connected to receive the burn-in signal, and whose output serves as the clock signal used to drive the first counter.

15. The embedded memory device of claim 14, wherein the first counter is a multi-bit counter.

16. The embedded memory device of claim 14, wherein the second counter is a one-bit counter.

17. The embedded memory device of claim 14, wherein the address buffer includes:

an inverter whose input end is connected to receive the burn-in signal;

a first pass gate having a first data port for outputting the system address, if selected, as the memory address, a second data port for receiving the system address, a first control port connected to the output of the inverter, and a second control port connected to receive the burn-in signal; and a second pass gate having a third data port for outputting the counter address, if selected, as the memory address, a fourth data port for receiving the counter address, a third control port connected to receive the burn-in signal, and a fourth control port connected to the output of the inverter.

18. The embedded memory device of claim 17, wherein the first control port is a positive control port of the first pass gate, which, when receiving a high-voltage logic state, causes the first pass gate to be switched to a conducting state.

19. The embedded memory device of claim 17, wherein the second control port is a negative control port of the first pass gate, which, when receiving a low-voltage logic state, causes the first pass gate to be switched to a conducting state.

20. The embedded memory device of claim 17, wherein the third control port is a positive control port of the second pass gate, which, when receiving a high-voltage logic state, causes the first pass gate to be switched to a conducting state.

21. The embedded memory device of claim 17, wherein the fourth control port is a negative control port of the second pass gate, which, when receiving a low-voltage logic state, causes the second pass gate to be switched to a conducting state.

22. The embedded memory device of claim 14, wherein the data buffer includes:

an inverter whose input end is connected to receive the burn-in signal;

a third pass gate having a fifth data port for outputting the counter data, if selected, as the memory data, a sixth data port for receiving the counter data, a fifth control port connected to receive the burn-in signal, and a sixth control port connected to the output of the inverter; and a fourth pass gate having a seventh data port for outputting the system data, if selected, as the memory data, an eighth data port for receiving the system data, a seventh control port connected to the output of the inverter, and an eighth control port connected to receive the burn-in signal.

23. The embedded memory device of claim 22, wherein the fifth control port is a positive control port of the third pass gate, which, when receiving a high-voltage logic state, causes the third pass gate to be switched to conducting state.

24. The embedded memory device of claim 22, wherein the sixth control port is a negative control port of the third pass gate, which, when receiving a low-voltage logic state, causes the third pass gate to be switched to conducting state.

25. The embedded memory device of claim 22, wherein the seventh control port is a positive control port of the fourth pass gate, which, when receiving a high-voltage logic state, causes the fourth pass gate to be switched to conducting state.

26. The embedded memory device of claim 22, wherein the eighth control port is a negative control port of the fourth pass gate, which, when receiving a low-voltage logic state, causes the fourth pass gate to be switched to conducting state.

27. An embedded memory device, which comprises:

a memory unit for data storage;

a control logic unit, which is capable of generating an output of system data and an output of system address;

a first counter which is driven by a system clock signal for generating an output of counter address;

a second counter which is capable of generating an output of counter data in response to the most significant bit of the output counter address from the first counter;

an address buffer, under control by a burn-in signal, for selecting either the system address from the control logic unit or the counter address from the first counter as memory address to the address decoder, in such a manner that when the burn-in signal is switched to a first logic state, the counter address is selected, and when the burn-in signal is switched to a second logic state, the system address is selected; and a data buffer, also under control by the burn-in signal, for selecting either the counter data from the second counter or the system data from the control logic unit as memory data to the sense amplifier, in such a manner that when the burn-in signal is switched to the first logic state, the counter data is selected, and when the burn-in signal is switched to the second logic state, the system data is selected.

28. The embedded memory device of claim 27, wherein the first counter is a multi-bit counter.

29. The embedded memory device of claim 27, wherein the second counter is a one-bit counter.

30. The embedded memory device of claim 27, wherein the device further comprises:

a NAND gate having a first input end connected to an input pin for receiving an externally generated clock signal and a second input end connected to receive the burn-in signal, and whose output serves as the clock signal used to drive the first counter.

31. The embedded memory device of claim 30, wherein the first counter is a multi-bit counter.

32. The embedded memory device of claim 30, wherein the second counter is a one-bit counter.

33. A method for performing a burn-in process on an embedded memory device having a memory unit having an address decoder and a sense amplifier, comprising the steps of:

(1) generating an output of counter address;

(2) generating an output of counter data;

(3) generating an output of system address and an output of system data;

(4) selecting either the counter address or the system address as memory address to the address buffer based on the current state of the burn-in signal, in such a manner that when the burn-in signal is switched to a first logic state indicative of initiation of the burn-in process, the counter address is selected otherwise, the system address is selected; and (5) selecting either the counter data or the system data as memory data to the sense amplifier based on the current state of the burn-in signal, in such a manner that when the burn-in signal is switched to the first logic state, the counter data is selected, otherwise, the system data is selected.

* * * * *

UNITED STATES PATENT AND TRADEMARK OFFICE
CERTIFICATE OF CORRECTION

PATENT NO.   : 6,034,880
DATED        : March 7, 2000
INVENTOR(S)  : Chen et al.

It is certified that error appears in the above-identified patent and that said Letters Patent is hereby corrected as shown below:

Title page, Item [75], delete "Tony Chen, Ping-Chen" and insert -- Tony Chen, Taoyuan Hsien--.

In column 6, line 11, delete "prior art Moreover," and insert -- prior art. Moreover, -- .

Signed and Sealed this

Tenth Day of April, 2001

Attest:

NICHOLAS P. GODICI

Attesting Officer

Acting Director of the United States Patent and Trademark Office